(12) United States Patent
Luo

(10) Patent No.: US 10,453,831 B2
(45) Date of Patent: Oct. 22, 2019

(54) PUNCHING PACKAGED LIGHT-EMITTING DIODE APPARATUS AND MANUFACTURING METHOD THEREOF

(71) Applicant: Guan-Jie Luo, Taipei (TW)

(72) Inventor: Guan-Jie Luo, Taipei (TW)

(73) Assignee: Guan-Jie Luo, Taipei (TW)

( * ) Notice: Subject to any disclaimer, the term of this patent is extended or adjusted under 35 U.S.C. 154(b) by 0 days.

(21) Appl. No.: 16/016,608

(22) Filed: Jun. 24, 2018

(65) Prior Publication Data

US 2019/0013304 A1    Jan. 10, 2019

(30) Foreign Application Priority Data

Jul. 10, 2017 (CN) .......................... 2017 1 0556365

(51) Int. Cl.
*H01L 33/64* (2010.01)
*H01L 25/16* (2006.01)
*H01L 33/60* (2010.01)
*H01L 25/075* (2006.01)
*H01L 33/48* (2010.01)
*F21Y 115/10* (2016.01)
*H01L 33/56* (2010.01)
*F21K 9/232* (2016.01)
*H01L 33/62* (2010.01)
*H01L 33/50* (2010.01)

(52) U.S. Cl.
CPC ........ *H01L 25/167* (2013.01); *H01L 25/0753* (2013.01); *H01L 33/483* (2013.01); *H01L 33/60* (2013.01); *H01L 33/64* (2013.01); *H01L 33/644* (2013.01); *F21K 9/232* (2016.08); *F21Y 2115/10* (2016.08); *H01L 33/504* (2013.01); *H01L 33/56* (2013.01); *H01L 33/62* (2013.01); *H01L 33/641* (2013.01); *H01L 2933/005* (2013.01); *H01L 2933/0033* (2013.01); *H01L 2933/0091* (2013.01)

(58) Field of Classification Search
None
See application file for complete search history.

(56) References Cited

U.S. PATENT DOCUMENTS

| | | | | |
|---|---|---|---|---|
| 2013/0070441 A1* | 3/2013 | Moon | .................... | H01L 33/486 362/84 |
| 2014/0085884 A1* | 3/2014 | Horio | .................. | H01L 25/0753 362/235 |
| 2016/0111614 A1* | 4/2016 | Lee | ........................ | H01L 33/483 257/98 |
| 2018/0132329 A1* | 5/2018 | Yan | ..................... | H01L 25/0753 |

* cited by examiner

*Primary Examiner* — Minh Loan Tran
(74) *Attorney, Agent, or Firm* — Anna Tsang

(57) ABSTRACT

The invention provides a punching packaged light-emitting diode apparatus, which comprises: a substrate, including a first molding material, a first nano heat conductive material, and a first fluorescent material; a light-emitting unit, located on a surface of the substrate; two wiring units, individually connected to the light-emitting unit; and a packaging material, including a second molding material, a high refractive material, a second nano heat conductive material, and a second fluorescent material, to cover the wiring units and the light-emitting unit in a solidified structure formed by a punching process; wherein, the light-emitting unit emits light to outside through the substrate and the packaging material.

11 Claims, 6 Drawing Sheets

PUNCHING PACKAGED LIGHT-EMITTING DIODE APPARATUS AND MANUFACTURING METHOD THEREOF

CROSS REFERENCE

THE present invention claims priority to CN201710556365.6, FILED ON Jul. 10, 2017.

BACKGROUND OF THE INVENTION

Field of Invention

The present invention relates to a punching packaged light-emitting diode apparatus and manufacturing method thereof, especially a punching packaged light-emitting diode apparatus with a high refractive index and manufacturing method thereof.

Description of Related Art

In comparison with the conventional halogen or incandescent lamps, a light-emitting diode (LED) becomes a key development trend because of higher light emission efficiency and longer lifetime. The conventional package of the LED chip uses a chip-on-board (COB) technology to locate the light-emitting diode chip on an aluminum substrate, a PCB substrate, or a ceramic substrate, wherein the conventional package has the problems of light emission from only one side of the substrate, and a low light emission efficiency. Another conventional package technology is to locate an LED chip on a glass substrate (chip on glass), wherein the light emission efficiency is better, while the glass substrate has a poor heat dissipation efficiency, a low yield rate, and two different color temperatures of the light emission respectively corresponding to two sides of the glass substrate. Thus, the aforementioned conventional packages still need improvement.

FIG. 1 illustrates a structure of a conventional light-emitting diode 10. The light-emitting diode 10 includes a substrate unit 11, a silver electric conduction unit 12, a heat sink 13, a light-emitting unit 14 and a packing unit 15. The substrate unit 11 may be a ceramic substrate 11. The silver electric conduction unit 12 includes two top conductive pads disposed on a top surface of the ceramic substrate 11, two bottom conductive pads disposed on a bottom surface of the ceramic substrate 11, and a plurality of conductive penetration layers through the ceramic substrate 11 and respectively electrically connected between the top conductive pads and the bottom conductive pads. The heat sink 13 includes a top heat dissipating block disposed on the top surface of the ceramic substrate 11 and a bottom heat dissipating block disposed on the bottom surface of the ceramic substrate 11. The light-emitting unit 14, includes a light-emitting component (included in 14) disposed on the top heat dissipating block and electrically connected to the two top conductive pads through two wiring units 12. The packing unit 15 includes a packing resin (included in 15) disposed over the silver electric conduction unit 12 and covering the light-emitting units (included in 14).

In the aforementioned light-emitting diode 10, the heat generated by the light-emitting component (included in 14) is conducted to the outside of the light-emitting diode 10 through the top heat dissipation block 13, the ceramic substrate 11, and the bottom heat dissipation block 13, to obtain a better heat dissipation effect. Under a current thinner requirement trend, although the heat dissipation effect of the package structure of the light-emitting diode 10 can be improved, the light-emitting diode 10 still needs to be thinned, wherein a thickness of the light-emitting diode 10 is too large, and the cooling element 13 design is complicated and its cooling efficiency is not good enough. In addition, the manufacturing method of the light-emitting diode 10 includes a dicing/cutting step, which makes the manufacturing steps of the light-emitting diode 10 more complicated and the ceramic substrate 11 to be vulnerable. Further, the ceramic substrate 11 is an opaque material, such that the light-emitting diode 10 cannot emit light in all directions/three spatial dimensions and the light emission efficiency is limited.

The efficiency of the light-emitting component in the light-emitting diode 10 is based on the efficiency of internal quantum conversion, the external quantum conversion, and the light extraction efficiency of the packaging material. Internal quantum conversion efficiency is the efficiency of electro-optical conversion after the light-emitting diode 10 chip is turned on. Usually, the internal quantum efficiency of the light-emitting diode chip is very high, but the external quantum efficiency of the light-emitting diode chip and the light extraction efficiency of the packaging material are very low, such that the final light emission efficiency of the light-emitting diode chip to be lower than the internal quantum conversion efficiency of the light-emitting diode chip. Poor external quantum efficiency of the light-emitting diode chip and poor light extraction efficiency of the packaging material are mainly caused by the total reflection between the different materials and the light absorption of the packaging material. In the light-emitting component, the light is emitted from an active layer in the light-emitting diode chip by combining the electrons and the holes, and to the outside through the packaging material. The light path passes many materials with different refractive indexes (such as epitaxial layer or packaging material layer), wherein the light emission could be not effective due to the total reflection phenomenon at the interfaces between the materials with different refractive indexes (when the light enters a low refractive index material from a higher refractive material). Therefore, the generated light is limited in the light-emitting component of the light-emitting diode, to be absorbed inside the packaging material to generate the heat, which may reduce the light emission efficiency and the lifetime of the light-emitting diode.

As explained above, only 15-20% of the input power of the light-emitting diodes in the present market can be converted into the light, wherein nearly 80-85% of the input power is converted into heat. If the heat cannot be conducted in time, the interface temperature in the light-emitting diode chip will be too high, and the light emission intensity and the lifetime will be seriously influenced.

Therefore, how to provide a simple design for increasing the external quantum conversion efficiency of the light-emitting diode chip and the light extraction efficiency of the packaging material, is an important key for improving the light-emitting diode.

SUMMARY OF THE INVENTION

In view of the above, the present invention provides a punching packaged light-emitting diode apparatus and manufacturing method thereof, wherein a multifunctional substrate with a lens function is provided by adjusting a composition of the materials with different refractive indexes in a packaging material, for improving light penetration and heat conduction of the packaging material.

Besides, according to the present invention, the heat conduction of the light-emitting diode is improved since the packaging stage: forming an advanced high heat conduction lens substrate with multiple functions, by choosing the material of the heat conduction substrate and by improving the heat conduction in the dielectric layer (insulation layer), to improve the external quantum efficiency of the light-emitting diode chip and the light extraction efficiency of the packaging material.

In the present invention, the high refractive material is included in the packaging material, which is effectively formed by a punching step, such that a light emission spectrum by the punching packaged light-emitting diode apparatus according to the present invention, is different from a light emission spectrum by the conventional light-emitting diode. Further, the punching packaged light-emitting diode apparatus provides a spectrum similar to the solar spectrum, and it provides a great improvement over the conventional light-emitting diode.

In one perspective, the present invention provides a punching packaged light-emitting diode apparatus, comprising: a substrate, including a first molding material, a first nano heat conductive material, and a first fluorescent material; a light-emitting unit, located on a surface of the substrate; two wiring units, individually connected to the light-emitting unit; and a packaging material, including a second molding material, a high refractive material, a second nano heat conductive material, and a second fluorescent material, to cover the wiring units and the light-emitting unit in a solidified structure formed by a punching process; wherein, the light-emitting unit emits light to the outside of the punching packaged light-emitting diode apparatus through the substrate and the packaging material. The aforementioned molding material is a material configured for solidifying purpose in a mold tooling.

In one embodiment, the first nano heat conductive material or the second nano heat conductive material includes: organic nano powders, inorganic nano powders, organic nano particles, inorganic nano particles, metal particles, metal oxide particles, ceramic particles, carbonaceous particles, or any combination of two or more thereof.

In one embodiment, the high refractive material includes: $TiO_2$, $Nb_2O_5$, $Ta_2O_5$, $ZrO_2$, Si, GaP, Ge, InP, PbS, or any combination of two or more thereof.

In one embodiment, the first fluorescent material or the second fluorescent material includes: yellow fluorescent material, red fluorescent material, green fluorescent material, or orange fluorescent material, wherein a composition of the first fluorescent material or the second fluorescent material includes: aluminate fluorescent material, silicate fluorescent material, nitride fluorescent material, oxynitride fluorescent material, or any combination of two or more thereof.

In one perspective, the present invention provides a manufacturing method of the punching packaged light-emitting diode apparatus, which comprises: providing a plurality of light-emitting units and a packaging material, the light-emitting units for example including light-emitting diodes, the packaging material for example including a curable epoxy resin gel, a fluorescent rendering material, a nano heat dissipation additive material, or a high refractive material; providing a mold tooling for a punching forming process, the mold tooling including a cavity with a corresponding shape to a packing cover of the punching package; locating each of the light-emitting units in a predetermined position inside the cavity, and encapsulating the light-emitting units with the packaging material, wherein steps of resin soaking and screening are included; performing a high temperature structure hardening step to have evenly fusion/chemical bonding between the materials included in the packaging material; putting the light-emitting unit encapsulated with the packaging material in a progressive punching machine, to form the punching package; soaking the punching package with a resin, to form the light-emitting diode in the punching package in a strip structure with a constant length; performing an annealing and post-bake step, for stabilizing a shape of the light-emitting diode in the punching package, and for releasing the accumulated stress in the light-emitting diode in the punching package, such that the packaging material can be solidified to cover the light-emitting units; and performing a post-processing step, including a glassy coverage, an anti-rust surface treatment, or other post-processing steps on the light-emitting diode in the punching package in the strip structure.

In one embodiment, the nano heat conductive material includes: organic nano powders, inorganic nano powders, organic nano particles, inorganic nano particles, metal particles, metal oxide particles, ceramic particles, carbonaceous particles, or any combination of two or more thereof.

In one embodiment, the high refractive material includes: $TiO_2$, $Nb_2O_5$, $Ta_2O_5$, $ZrO_2$, Si, GaP, Ge, InP, PbS, or any combination of two or more thereof.

In one embodiment, the fluorescent material includes: yellow fluorescent material, red fluorescent material, green fluorescent material, or orange fluorescent material, wherein a composition of the first fluorescent material or the second fluorescent material includes: aluminate fluorescent material, silicate fluorescent material, nitride fluorescent material, oxynitride fluorescent material, or any combination of two or more thereof.

In the punching packaged light-emitting diode apparatus according to the present invention, the substrate and the packaging material can be translucent, transparent, or semi-transparent, such that they can emit the light in all directions/three spatial dimensions, to achieve the light emission effect in all steradians.

Figure 6:
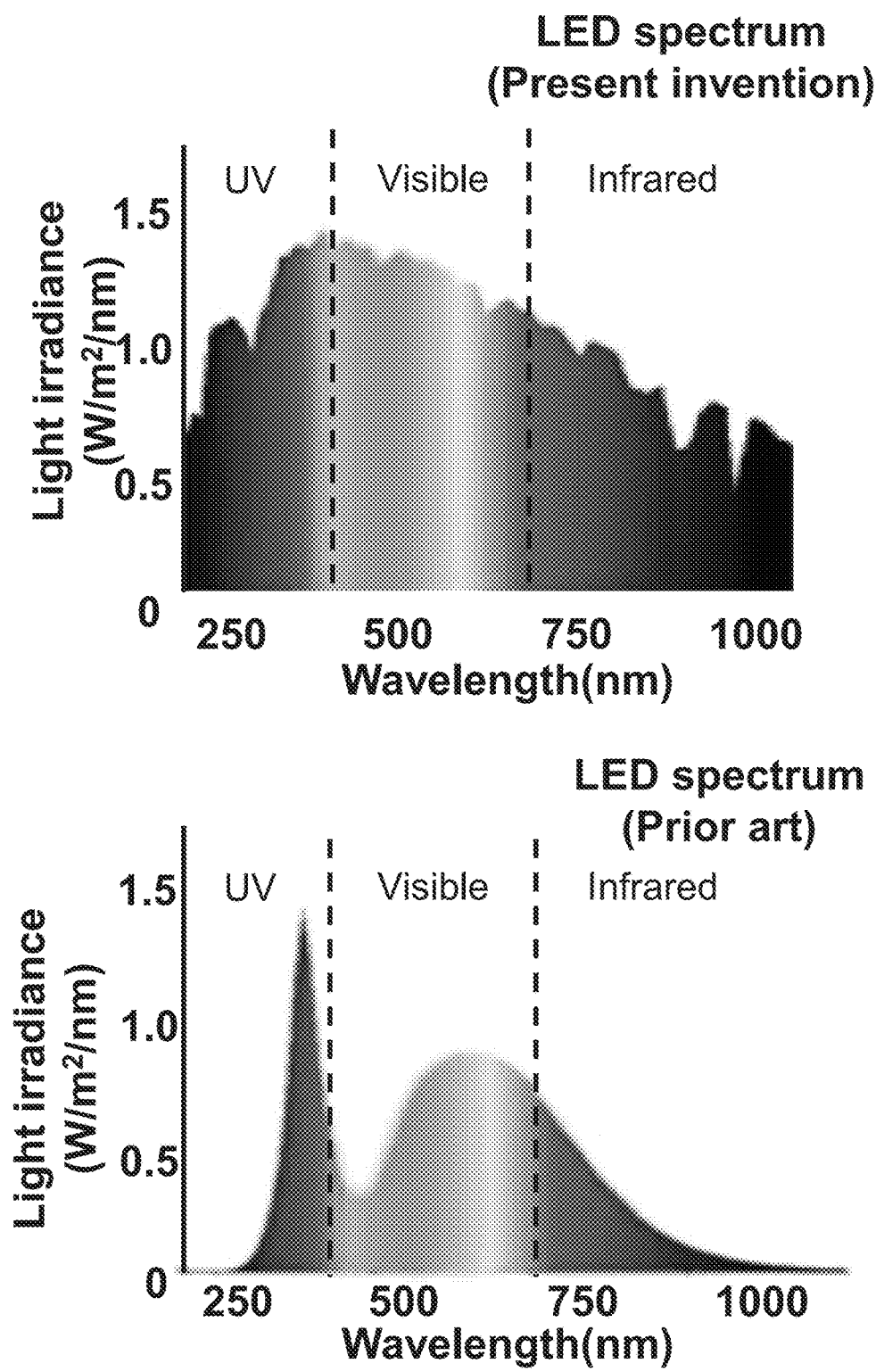

The top half of FIG. 6 illustrates a light emission spectrum by the punching packaged light-emitting diode apparatus according to the present invention, and the bottom half of FIG. 6 illustrates a light emission spectrum by the prior art light-emitting diode apparatus.

DESCRIPTION OF THE PREFERRED EMBODIMENTS

The objectives, technical details, features, and effects of the present invention will be better understood with regard to the detailed description of the embodiments below, with reference to the drawings.

Figure 1:
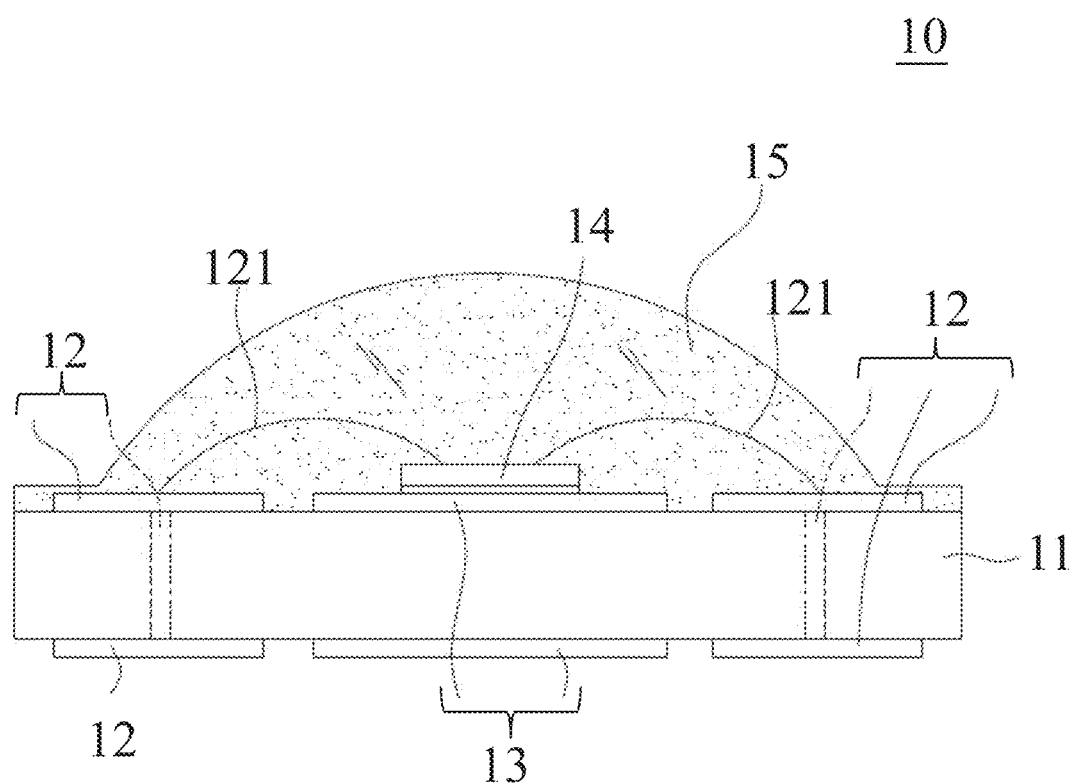
FIG. 1 illustrates a prior art light-emitting diode package.
Figure 2A:
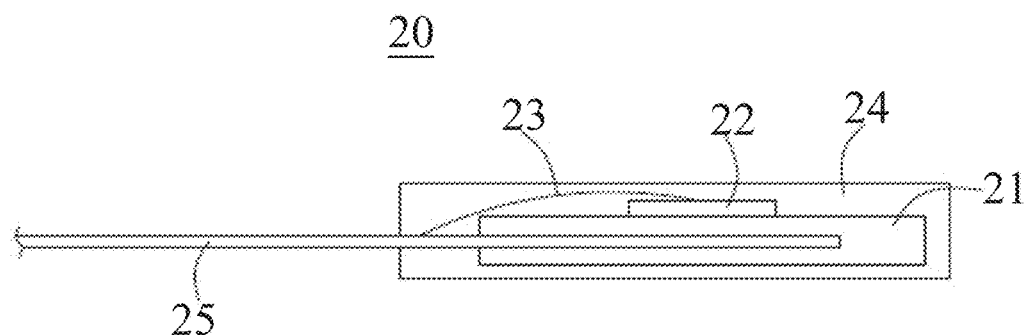
FIGS. 2A-2B illustrate a punching packaged light-emitting diode apparatus according to one embodiment of the present invention.
Figure 2B:
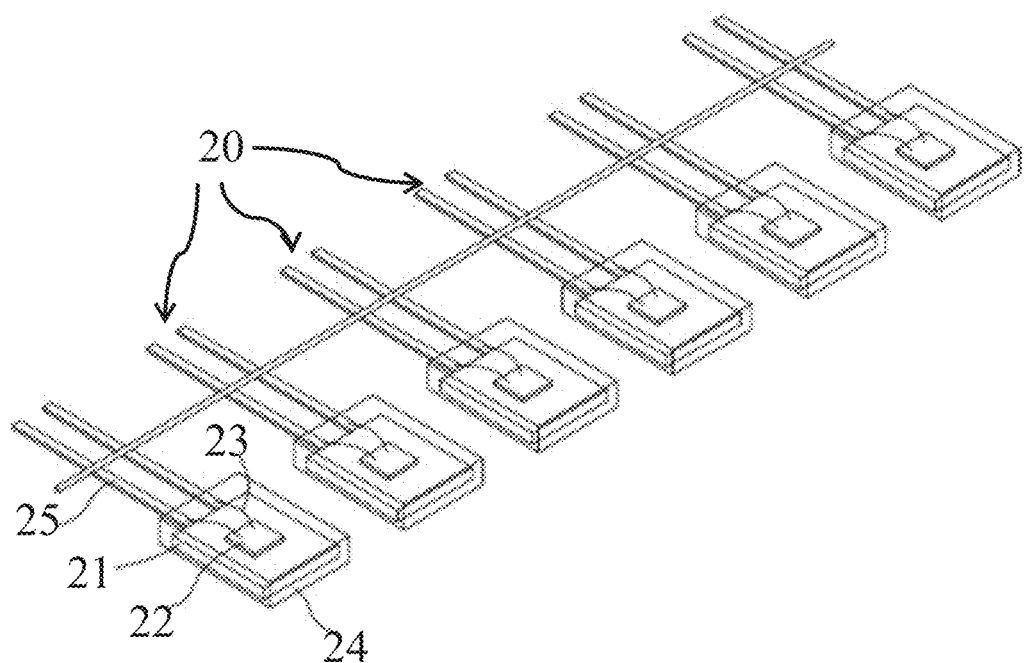

FIGS. 2A and 2B, illustrate a punching packaged light-emitting diode apparatus 20 according to one embodiment of the present invention, which includes a substrate 21, a light-emitting unit 22, two wiring units 23, a packing cover 24, and two conduction pins 25. The substrate 21 can be a translucent substrate 21, such as a transparent fluorescent resin substrate 21 or a transparent fluorescent ceramic substrate 21, which includes a nano heat conductive material and a fluorescent material. The light-emitting unit 22 is located on the substrate 21, and the substrate 21 and the packing cover 24 together cover the light-emitting unit 22. The light-emitting unit 22 is preferably a light-emitting diode (LED) chip, and the packing cover 24 is a solidified structure formed by a punching process. The packing cover 24 can be a translucent packing cover 24, which includes a molding material, a high refractive material, the nano heat conductive material, and the fluorescent material. The light-emitting unit 22 emits light through the fluorescent material in the molding material, to the outside of the packing cover 24. Besides, in FIG. 2B, a plurality of the punching packaged light-emitting diode apparatuses 20 can be connected in parallel or in series, for different functional requirements. The wiring units 25 connected to the light-emitting unit 22 can but do not necessarily include two conduction pins (for example, the two conduction pins shown in FIGS. 2A and 2B).

Figure 3A:
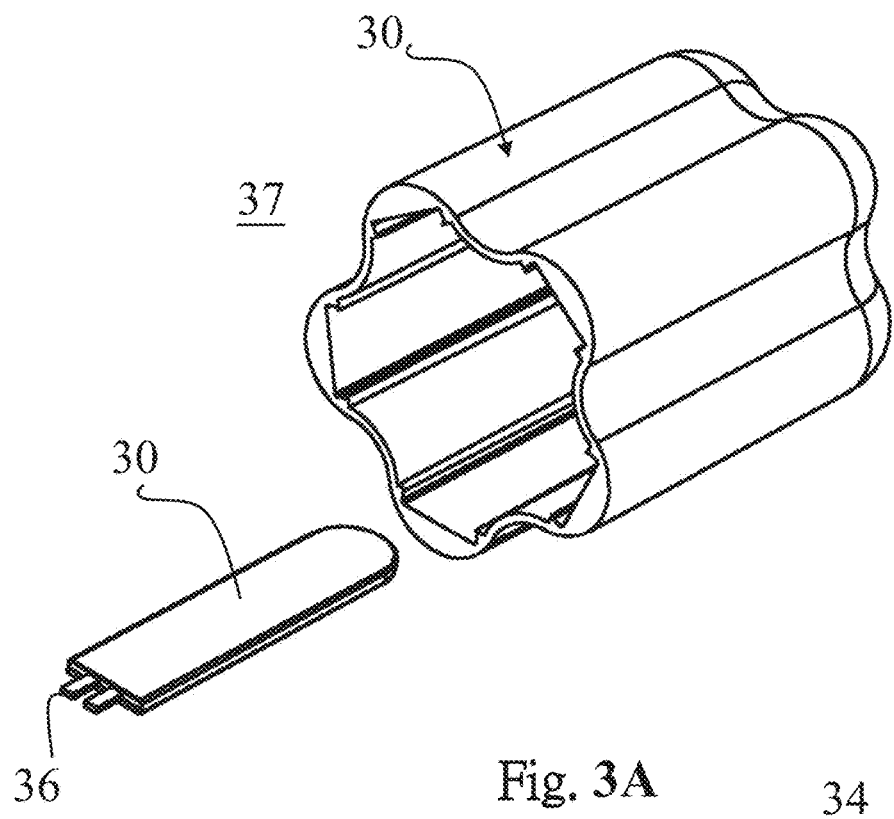
FIGS. 3A-3B illustrate a punching packaged light-emitting diode apparatus according to one embodiment of the present invention.
Figure 3B:
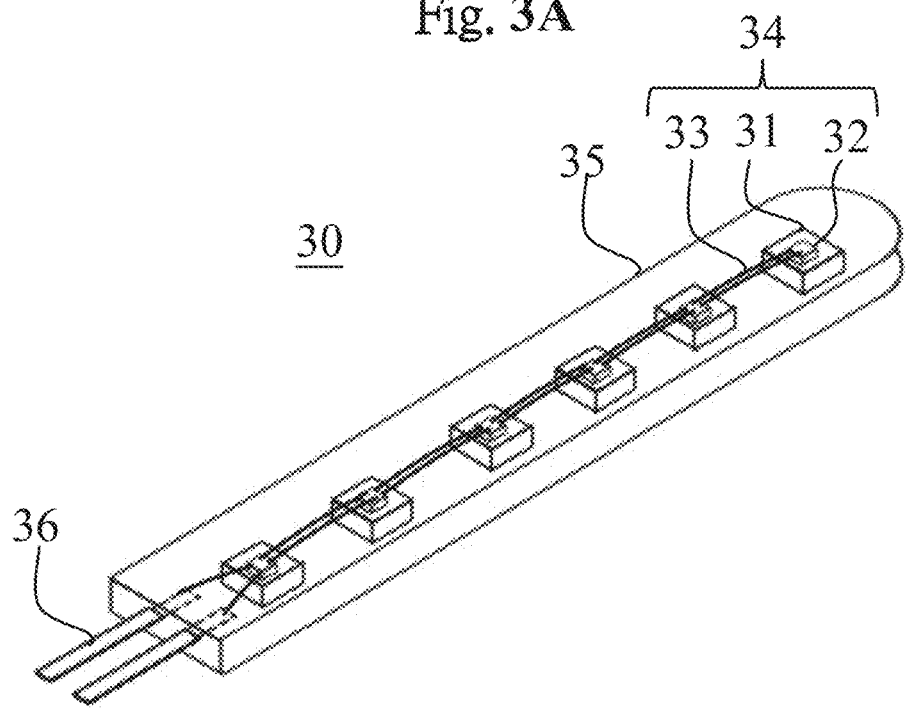

Please refer to FIGS. 3A and 3B, wherein FIG. 3B illustrates the punching packaged light-emitting diode apparatus 30 according to one embodiment of the present invention. The punching packaged light-emitting diode apparatus 30 includes a light-emitting diode unit 34, a packing cover 35, and two conduction pins 36. As shown in FIG. 3B, the punching packaged light-emitting diode apparatus 30 has a strip structure, which includes a plurality of light-emitting diode devices 34. Each of the light-emitting diode devices 34, includes a substrate 31, a light-emitting unit 32, and two wiring units 33. The substrate 31 can be a translucent substrate 31, such as a transparent fluorescent resin substrate 31, or a transparent fluorescent ceramic substrate 31, wherein the substrate 31 includes the nano heat conductive material and the fluorescent material. The light-emitting unit 32 is located on the substrate 31, and the light-emitting unit 32 and the packing cover 34 together cover the light-emitting unit 32. The light-emitting unit 32 is preferably a light-emitting diode (LED) chip, and the packing cover 35 is a solidified structure formed by a punching process. The packing cover 35 can be a translucent packing cover 35, which includes the molding material, the high refractive material, the nano heat conductive material, and the fluorescent material. The light-emitting unit 32 or the light-emitting diode unit 34 emits the light through the fluorescent material in the molding material, to the outside of the packing cover 24. Besides, in FIG. 3A, a plurality of the punching packaged light-emitting diode apparatuses 30 can further be electrically connected, to be integrated into a light-emitting diode shell structure 37. The wiring units 33 of the punching packaged light-emitting diode apparatus 30 can electrically connect with two conduction pins 36 (shown in FIG. 3B).

Figure 4A:
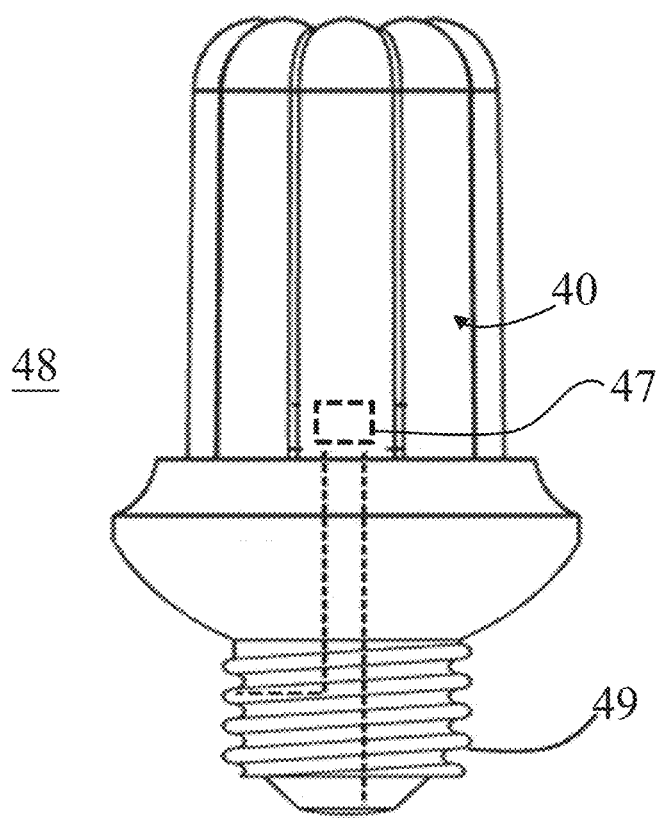
FIGS. 4A-4B illustrate a punching packaged light-emitting diode apparatus according to one embodiment of the present invention.
Figure 4B:
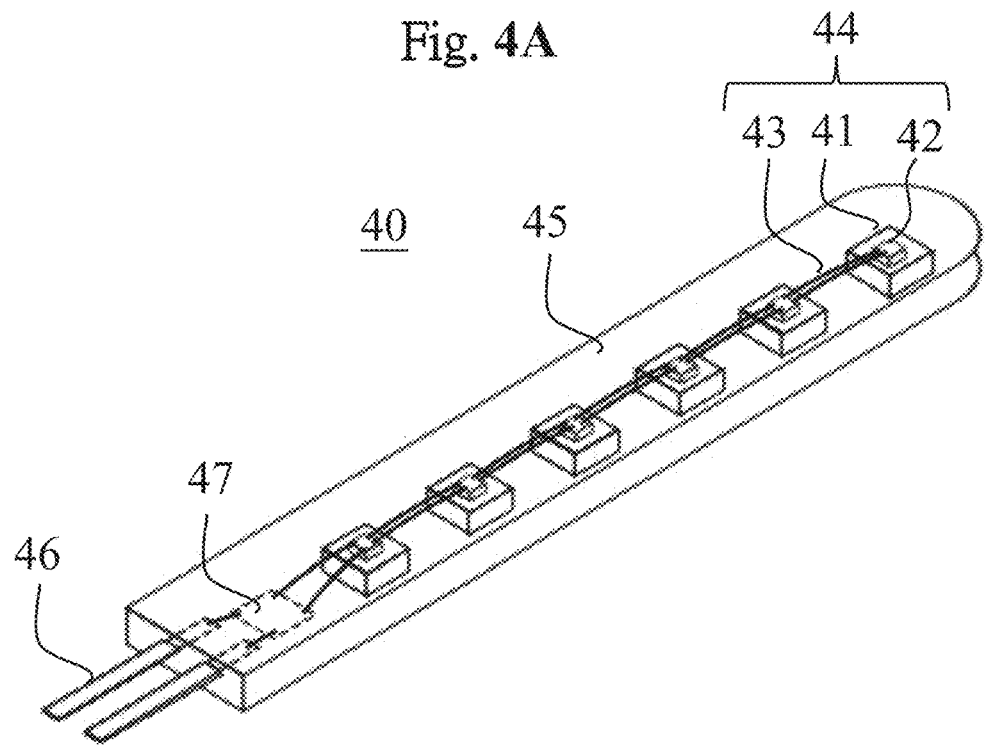

FIGS. 4A and 4B, illustrate the punching packaged light-emitting diode apparatus 40 according to one embodiment of the present invention. The punching packaged light-emitting diode apparatus 40 includes a light-emitting diode device 44, a packing cover 45, two conduction pins 46 and a driving circuit 47. As shown in FIG. 4B, the punching packaged light-emitting diode apparatus 40 has a strip structure, which includes a plurality of light-emitting diode devices 44 and the driving circuit 47. Each of the light-emitting diode devices 44, includes a substrate 41, a light-emitting unit 42, and two wiring units 43. The substrate 41 can be a translucent substrate 41, such as a transparent fluorescent substrate 41, or a transparent fluorescent ceramic substrate 41, wherein the substrate 41 includes the nano heat conductive material and the fluorescent material. The driving circuit 47 electrically connects with the two wiring units 43. The light-emitting unit 42 is located on the substrate 41, wherein the translucent substrate 41 and the packing cover 44 together cover the light-emitting unit 42. The light-emitting unit 42 is preferably a light-emitting diode (LED) chip, and the packing cover 45 is a solidified structure formed by a punching process. The packing cover 45 can be a translucent packing cover 45, which includes the molding material, the high refractive material, the nano heat conductive material, and the fluorescent material. The light-emitting unit 42 or the light-emitting diode unit 44 emits the light through the fluorescent material in the molding material, to the outside of the packing cover 45. Besides, in FIG. 4A, a plurality of the punching packaged light-emitting diode apparatuses 40 can further be electrically connected, to be integrated into a light-emitting diode lamp set 48. The light-emitting diode lamp set 48 includes a lamp set 49, for electrically connecting the punching packaged light-emitting diode apparatuses 40 and an external power source (not shown).

The packing cover 24, 35, and 45 of the present invention individually include the high refractive material, which accounts for 5%~80% of the total weight to adjust for pairing the refractive indexes of the adjacent materials therein, to regulate and improve light emission stability and thermal stability, which can reduce a light scatter loss of the fluorescent powers in the packaging material, and increase a lifetime and a light extraction rate of the light-emitting diode. Usually, a refractive index of the light-emitting diode chip is between 2 and 4 ($n_{LED}$=2-4), which is much higher than the refractive indexes of epoxy resin or silica resin packaging material (the refractive rate between 1.4 and 1.53 ($n_{PACKAGE}$=1.4-1.53). Therefore, when the chip emits the light through the packaging material, total reflection often occurs at an interface between the different materials such that a large amount of the light is reflected back into the chip, to fail to effectively emit the light, such that it seriously affects the light emission efficiency. Therefore, one feature of the present invention is to increase the refractive index of the packaging material, and to provide a transparent packaging material with a high refractive index, for reducing the refractive index difference between the light-emitting diode chip and the packaging material. For example, the refractive index of epoxy resin is 1.5, and the refractive index of glass is about 1.55, wherein after blending the high refractive index (rough higher than 1.5, e.g., higher than 1.55) material into the packaging material, the refractive index difference between the light-emitting diode chip and the packaging material can be reduced.

Please refer to table 1 below, wherein the materials with their refractive indexes higher than 1.5 are listed.

TABLE 1

| | Optical Items | |
| --- | --- | --- |
| Nano powders | Refractive index (n) | Visible light absorption |
| $TiO_2$ | 2.31 | Negative |
| $Nb_2O_5$ | 2.25 | Negative |

TABLE 1-continued

| Nano powders | Optical Items | |
|---|---|---|
| | Refractive index (n) | Visible light absorption |
| $Ta_2O_5$ | 2.04 | Negative |
| $ZrO2$ | 2.05 | Negative |
| Si | 4.30 | Negative |
| Ge | 4.34 | Positive |
| GaP | 3.59 | Negative |
| InP | 3.82 | Positive |
| PbS | 4.35 | Positive |

According to Table 1 above, the high refractive material in the package covers 24, 35, and 45 according to the present invention can include $TiO_2$, $Nb_2O_5$, $Ta_2O_5$, $ZrO_2$, Si, GaP, or a combination of two or more thereof. In one embodiment, besides the aforementioned combinations, the high refractive material can further include Ge, InP, PbS, or a combination of two or more thereof. Please refer to Table 1, wherein the materials of $TiO_2$, $Nb_2O_5$, $Ta_2O_5$, $ZrO_2$, Si, GaP, have low visible light absorption, but high refractive indexes, such that these materials are excellent options of the high refractive material. The materials of Ge, InP and PbS, have high refractive indexes, but also high visible light absorption, such that dimensions of the particles of Ge, InP and PbS used in the high refractive material can be smaller than 50 nanometers (nm) in order to reduce the light scattering influence on the light emission efficiency. The proportion of the aforementioned high refractive material in the packing covers 24, 35, and 45 is preferably between 5% and 70%, and the preferred particle dimensions can be less than 50 nanometers (nm), for reducing the light scattering effect on the light emission efficiency.

Importantly, the shapes of the punching packaged light-emitting diode apparatuses 20, 30, 40, or the light-emitting units 22, 32, 42, can be but not limited to the shapes illustrated in figures. The user may modify the shapes according to requirement, and this modification is still within the spirit/scope of the present invention. Besides, the shapes of the punching packaged light-emitting diode apparatuses 20, 30, 40, and the light-emitting units 22, 32, 42, are also within the scope of the present invention.

In one embodiment, the fluorescent material in the substrates 21, 31, 41 and the packing covers 24, 35, 45, can include different material combinations according to the light emission requirements of the light-emitting units 22, 32, and 42, for adjusting the color rendering. For example, the fluorescent material can include: red fluorescent material, green fluorescent material, or orange fluorescent material, wherein a composition of the fluorescent material includes: aluminate fluorescent material, silicate fluorescent material, nitride fluorescent material, oxynitride fluorescent material, or any combination of two or more thereof. Or, the fluorescent material can include yellow fluorescent material, and optionally include red fluorescent material, green fluorescent material, or orange fluorescent material, wherein a composition of the fluorescent material includes: aluminate fluorescent material, silicate fluorescent material, nitride fluorescent material, oxynitride fluorescent material, or any combination of two or more thereof. According to the present invention, the combination of the fluorescent material can be decided according to color rendering requirement, or according to the light emission characteristics of the light-emitting units 22, 32, and 42.

In one embodiment, the in the substrate 21, 31, 41, or the packing cover 24, 35, 45 of the present invention include the nano heat conductive material, which accounts for 5%~80% of the total weight to improve the thermal conduction capability. The nano heat conductive material preferably includes: transparent organic nano powders, transparent inorganic nano powders, transparent organic nano particles, transparent inorganic nano particles, or a combination of two or more thereof. The transparent inorganic nano particles include: aluminum oxide nano particles, aluminum oxide powders, titanium oxide nano particles, titanium oxide nano powders, metal particles, metal oxide particles, ceramic particles, carbonaceous particles, high refractive glass particles, high refractive glass powders, or any combination of two or more thereof. As mentioned above, the punching packaged light-emitting diode apparatuses 20, 30, and 40 of the present invention can emit the light in all directions/three spatial dimensions, and the materials therein must be translucent or transparent. Therefore, the dimension limitation of the nano heat conductive particles is to prevent the light passage from being shielded in the molding material of the packing covers 24, 35, and 45, such that the light emission efficiency of the light-emitting units 14, 22, 32, and 42 is slightly reduced. The aforementioned metal particles can include copper particles, silver particles, or aluminum particles. The aforementioned metal oxide particles can include aluminum oxide particles or zinc oxide particles. The aforementioned ceramic particles can include boron nitride particles, aluminum nitride particles, silicon carbide particles, or nano clay particles. The aforementioned carbonaceous particles may include graphite particles, carbon fiber particles, or nano carbon particles. In addition, the proportion of the nano heat conductive material in the packing covers 24, 35, and 45 is preferably between 5% and 70%, wherein the nano heat conductive material includes the nano heat conductive particles, the dimension of which is preferably less than 50 nanometers (nm), to reduce the influence of light scattering on the light emission efficiency. In one embodiment, aluminum oxide nano particles or powders in the transparent inorganic nano particles, can be replaced by the high refractive glass particles or powders, which can be included in the punching package after the punching step.

In one embodiment, the molding material in the aforementioned packing covers 24, 35 and 45, can be referred to a prime material accounting for 10% to 90% of the total weight. For example, the molding material can include transparent organic resin (such as epoxy resin, siliane resin), or an inorganic transparent packaging material such as glass (borosilicate glass, sapphire glass, etc.), oxidized ceramic glass, or ceramic. For example, a composition of the molding material, preferably includes epoxy resin, bisphenol A epoxy resin, cycloaliphatic-epoxy resin, siloxane modified epoxy resin, acrylic modified epoxy resin, organic modified epoxy resin, silicone resin, silicone gel, silicone rubber, poly-siloxane resin, organic modified poly-siloxane resin, transparent ceramic material, or a combination of two or more thereof.

According to the above, the light emission efficiency of the punched packaged light-emitting diode apparatuses 20, 30, and 40 is superior over the prior art, wherein the light emission efficiency according to the present invention can be between 150 lm/W (lumens) and 200 lm/W (lumens). In one embodiment, the light emission efficiency can be above 300 lm/W. In addition, the design of the punching packaged light-emitting diode apparatuses 20, 30, and 40 have the feature of light emission in 360 degrees, which is not limited to the partial light emission angles in the prior art. Furthermore, the punching packaged light-emitting diode apparatuses 20, 30, and 40 can directly dissipate the heat to the external environment by radiation, thereby the excellent heat dissipation effect is achieved and the service lifetime is much prolonged.

In one embodiment, a surface of the package cover 24, 35, and 45 can be coated with a graphene material (not shown), and the coating may increase the light emission and the heat dissipation efficiencies of the package covers 24, 35, and 45.

Figure 5:
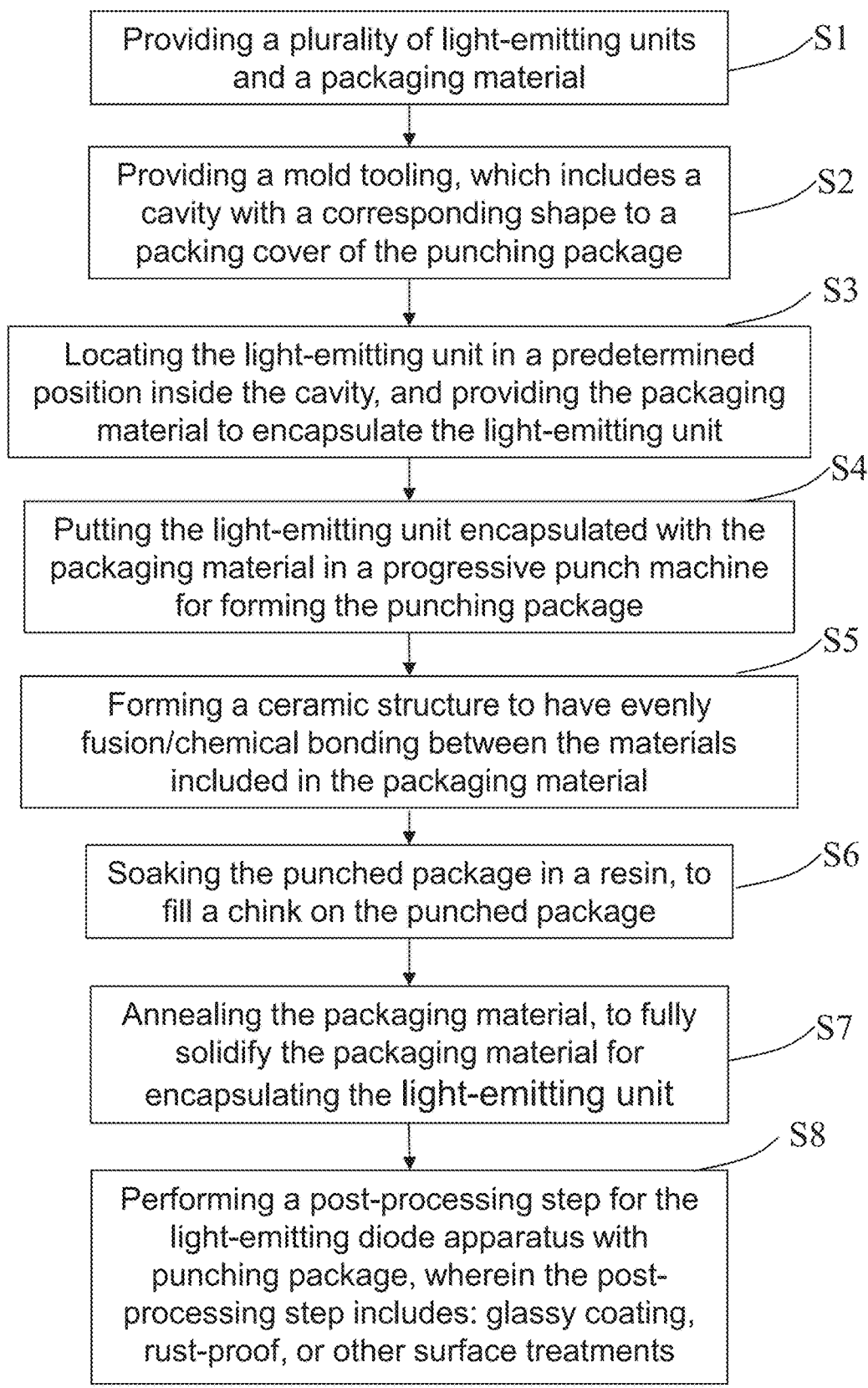
FIG. 5 illustrates a flow chart of a manufacturing method of the punching packaged light-emitting diode apparatus according to one embodiment of the present invention.

Please refer to FIG. 5, in one perspective, wherein a flowchart according to a manufacturing method of the punching packaged light-emitting diode apparatus is illustrated. The manufacturing method of the punching packaged light-emitting diode apparatus, including: providing a plurality of light-emitting units and a packaging material, the light-emitting units for example including light-emitting diodes, the packaging material for example including a curable epoxy resin gel, a fluorescent rendering material, a nano heat dissipation additive material, or a high refractive material (S1); providing a mold tooling for a punching forming process, the mold tooling including a cavity with a corresponding shape to a packing cover of the punching package (S2); locating each of the light-emitting units in a predetermined position inside the cavity, and covering the packaging material to encapsulate the light-emitting unit, which for example includes steps of resin soaking and screening (S3); putting the light-emitting unit encapsulated with the packaging material (FIGS. 2B, 3B, and 4B) in a progressive punching machine, to form the punching package of the light-emitting diode (for example, a strip structure with a constant length as shown in FIGS. 3B and 4B) (S4); performing a high temperature structure hardening step at the temperature between 400 and 900 degrees Celsius, to have evenly fusion/chemical bonding between the materials included in the packaging material (S5); soaking the punching package with a resin, to fill a crack/fissure in the punching package (for example, vacuum infiltration for a zero void purpose), wherein the resin may be heat-curable epoxy resin or heat-curable silicone resin (S6); performing an annealing and post-bake step (for example, keeping at the temperature of 120° C. about 1 hour), to stabilize the shape in the light-emitting diode in the punching package, and to release the residual stress in the light-emitting diode in the punching package, such that the packaging material can be fully solidified to cover the light-emitting units fixed therein (S7); and performing a post-processing step, including a glassy coverage, an anti-rust surface treatment, or other post-processing steps on the light-emitting diode in the punching package with the strip structure (S8). The time point or the step priority of the aforementioned "high temperature structure hardening" in the step S5, is not necessarily to be after the aforementioned "forming the punching package" in the step S4. In one embodiment, the step S5 can be performed before the steps S4, or just before the aforementioned "annealing" in the step S7. Or, in one embodiment, the aforementioned "high temperature structure hardening step" can be repeated several times. For example, the aforementioned "high temperature structure hardening step" can be performed before the aforementioned "forming the punching package" in the step S4, and before the aforementioned "annealing" in the step S7. In one embodiment, when the punching package is the strip structure, the shortest time period needed for the aforementioned "high temperature structure hardening step" can be around 2 minutes, which is much faster than at least 1 hour molding time in the prior art. Besides, the short molding time by aforementioned "high temperature structure hardening step" can have the benefits of easy operation, high production capability, and easy material control.

The punching packaged light-emitting diode apparatuses 20, 30, and 40 according to the present invention have the benefits of light emission in 360 degrees, high luminous flux, good heat dissipation, simple manufacturing process, high yield rate, and high production speed. Besides, the heat dissipation in the present invention can be in direct radiation into the air from the surface of the packing covers 24, 35, and 45, wherein there is no need to add or be covered with other heat sinks as the prior art. By the integrated fluorescent composite resin molding process, so the light emission has a uniform color temperature distribution without shadow or dark area.

Importantly, in the punched packaged light-emitting diode apparatuses of the present invention, the packing covers 24, 35, and 45 include the high refractive material, the optical performance of which is effectively maintained and effectively shaped after the punching step, such that light emission spectrum by the punching packaged light-emitting diode apparatus of the present invention, is different from the white light by the prior art light-emitting diode. The light emission spectrum by the punching packaged light-emitting diode apparatus is similar to a solar spectrum, which brings a great technological advance. As shown in FIG. 6, the top spectrum is the spectrum generated by the punched packaged light-emitting diode apparatus, wherein the horizontal axis represents the wavelength in units of nm, and the vertical axis represents the light irradiance in units of W/m2/nm. According to FIG. 6, a light irradiance (from ultraviolet region, visible region, through infrared region) by the punching packaged light-emitting diode apparatus shows a uniform distribution, without any spectral trough or sink, nor any peak area or prominent areas in the spectrum. Therefore, the punching packaged light-emitting diode apparatus has the similar solar spectrum, such that it brings a natural light emission effect which is suitable for human eyes. On the contrary, please refer to the bottom of FIG. 6, wherein a light irradiance (from ultraviolet region, visible region, through infrared region) by the prior art light-emitting diode shows a rough distribution which is not suitable for the human eyes. For example, there are a peak region at a wavelength of about 350 nm, a trough region at a wavelength of about 480 nm, and another peak region at a wavelength of about 600 nm.

The benefit of the present invention includes that the heat generated by the light-emitting units 22, 32, and 42 can be directly conducted and radiated into the outside air or environment, by the direct contacts respectively between the light-emitting units 22, 32, 42, and the packing covers 24, 35, 45. Therefore, the heat dissipation efficiency of the heat generated by the light-emitting units of the present invention is much better than the prior art. Besides, by the direct contacts respectively between the light-emitting units 22, 32, 42, and the packing covers 24, 35, 45, the light-emitting diode shell structure 37 and the light-emitting diode lamp set 48 can directly emit the light to the outside, without the similar attenuation through lampshade or lamp shell in the prior art. Therefore, the light emission efficiency of the present invention is better than the prior art. Moreover, the light paths from the light-emitting units 22, 32, and 42 pass only one similar material index, which are different from the light path through multiple materials (with different refractive indexes) in the prior art. Further, the light paths from the light-emitting units 22, 32, and 42 are much shorter than the light path by the prior art. Besides, in the manufacturing method of the punching packaged light-emitting diode apparatus, the aforementioned step of "soaking the punching package with the resin, to fill the crack/fissure in the punching package" can patch the crack/fissure in the punching package, such that the crack/fissure is patched to form a continuous material structure for the light path through the similar refractive index material in the punching packaged light-emitting diode apparatus, and the light path therein is not blocked even though there is the crack/fissure generated in the punching step. That is, in the present invention, the shorter light path requirement can be secured even though the manufacturing step generates the residual stress or the crack/fissure in the punching step.

Besides, the substrates 21, 31, 41 and the packing cover 24, 35, 45 of the present invention can be translucent, transparent, or semi-transparent, whereby the punched-packaged light-emitting diode apparatuses 20, 30 and 40 can emit the light in all directions (in three spatial dimensions/all steradians).

In addition, the molding material used in the present invention, has the benefits of acid resistance, alkali resistance, thermal shock (cold and heat) resistance, dust prevention, rust prevention, abrasion resistance, heavy weight endurance, and good water resistance. Further, in the present invention, the light emission is directly into the outside of the punching packaged light-emitting diode apparatus, and there is no in-between heat dissipation barrier, such that the heat dissipation efficiency of the present invention is much better than the prior art with heat accumulation around the light-emitting unit. Furthermore, the color rendering by the fluorescent powders in the present invention does not shield the light path, but provides a color rendering index of 95 or more which is similar to solar light as shown in FIG. 6.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention.

What is claimed is:

1. A punching packaged light-emitting diode apparatus, comprising:
    a substrate, including a first molding material, a first nano heat conductive material, and a first fluorescent material;
    a plurality of light-emitting diode devices, including:
        a light-emitting unit, located on a surface of the substrate;
        two wiring units, individually connected to the light-emitting unit;
    a packaging material, including a second molding material, a high refractive material, a second nano heat conductive material, and a second fluorescent material, to cover the wiring units and the light-emitting unit in a solidified structure formed by a punch process; and
    two conduction pins, electrically connecting with the wiring units;
    wherein, the light-emitting device emits light to the outside of the punching packaged light-emitting diode apparatus through the substrate and the packaging material.

2. The punching packaged light-emitting diode apparatus of claim 1, wherein the first nano heat conductive material or the second nano heat conductive material includes: aluminum oxide nano particles, aluminum oxide powders, organic nano powders, inorganic nano powders, organic nano particles, inorganic nano particles, metal particles, metal oxide particles, ceramic particles, carbonaceous particles, high refractive glass powders, high refractive glass particles, or any combination of two or more thereof.

3. The punching packaged light-emitting diode apparatus of claim 1, wherein the high refractive material accounts for 5%~80% of the total weight of the packaging material, and the high refractive material includes: $TiO_2$, $Nb_2O_5$, $Ta_2O_5$, $ZrO_2$, Si, GaP, Ge, InP, PbS, or any combination of two or more thereof.

4. The punching packaged light-emitting diode apparatus of claim 1, wherein the first fluorescent material or the second fluorescent material includes: yellow fluorescent material, red fluorescent material, green fluorescent material, or orange fluorescent material, and
    wherein a composition of the first fluorescent material or the second fluorescent material includes: aluminate fluorescent material, silicate fluorescent material, nitride fluorescent material, oxynitride fluorescent material, or any combination of two or more thereof.

5. A manufacturing method of the punching packaged light-emitting diode apparatus of claim 1, comprising:
    providing a plurality of light-emitting units and a packaging material, the packaging material including a molding material, a mixed fluorescent material, a nano heat conductive material, and a high refractive material;
    providing a mold tooling, which includes a cavity with a corresponding shape to a packing cover of the punched package;
    locating each of the light-emitting units in a predetermined position inside the cavity, providing the packaging material to encapsulate the light-emitting unit;
    putting the light-emitting unit encapsulated with the packaging material in a progressive punch machine for forming the punched package;
    soaking the punched package with a resin, to fill a crack/fissure on the punched package; and
    performing a post-processing step for the punching packaged light-emitting diode apparatus.

6. The manufacturing method of the punching packaged light-emitting diode apparatus of claim 5, wherein the high refractive material includes: $TiO_2$, $Nb_2O_5$, $Ta_2O_5$, $ZrO_2$, Si, GaP, Ge, InP, PbS, or any combination of two or more thereof.

7. The manufacturing method of the punching packaged light-emitting diode apparatus of claim 5, further comprising: after or before the step of forming the punched package, forming a ceramic structure to have evenly fusion/chemical bonding between the materials included in the packaging material, wherein the temperature for forming the ceramic structure is between 400 and 900 degrees Celsius.

8. A punching packaged light-emitting diode apparatus, integrated into a light-emitting diode lamp set, comprising:
    a substrate, including a first molding material, a first nano heat conductive material, and a first fluorescent material;
    a plurality of light-emitting diode devices, including:
        a light-emitting unit, located on a surface of the substrate;
        two wiring units, individually connected to the light-emitting unit;
    a driving circuit, electrically connecting with the two wiring units;
    a packaging material, including a second molding material, a high refractive material, a second nano heat conductive material, and a second fluorescent material, to cover the wiring units, the light-emitting unit and the driving circuit in a solidified structure formed by a punch process; and two conduction pins, electrically connecting with the driving circuit;

wherein, the light-emitting device emits light to the outside of the punching packaged light-emitting diode apparatus through the substrate and the packaging material.

9. The punching packaged light-emitting diode apparatus of claim 8, wherein the first nano heat conductive material or the second nano heat conductive material includes: aluminum oxide nano particles, aluminum oxide powders, organic nano powders, inorganic nano powders, organic nano particles, inorganic nano particles, metal particles, metal oxide particles, ceramic particles, carbonaceous particles, high refractive glass powders, high refractive glass particles, or any combination of two or more thereof.

10. The punching packaged light-emitting diode apparatus of claim 8, wherein the high refractive material accounts for 5%~80% of the total weight of the packaging material, and the high refractive material includes: $TiO_2$, $Nb_2O_5$, $Ta_2O_5$, $ZrO_2$, Si, GaP, Ge, InP, PbS, or any combination of two or more thereof.

11. The punching packaged light-emitting diode apparatus of claim 8, wherein the first fluorescent material or the second fluorescent material includes: yellow fluorescent material, red fluorescent material, green fluorescent material, or orange fluorescent material, and wherein a composition of the first fluorescent material or the second fluorescent material includes: aluminate fluorescent material, silicate fluorescent material, nitride fluorescent material, oxynitride fluorescent material, or any combination of two or more thereof.

* * * * *